US008889235B2

(12) United States Patent
Mallikarjunan et al.

(10) Patent No.: US 8,889,235 B2
(45) Date of Patent: Nov. 18, 2014

(54) DIELECTRIC BARRIER DEPOSITION USING NITROGEN CONTAINING PRECURSOR

(75) Inventors: Anupama Mallikarjunan, Macungie, PA (US); Raymond Nicholas Vrtis, Orefield, PA (US); Laura M. Matz, Allentown, PA (US); Mark Leonard O'Neill, San Marcos, CA (US); Andrew David Johnson, Doylestown, PA (US); Manchao Xiao, San Diego, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 614 days.

(21) Appl. No.: 12/772,518

(22) Filed: May 3, 2010

(65) Prior Publication Data

US 2010/0291321 A1 Nov. 18, 2010

Related U.S. Application Data

(60) Provisional application No. 61/177,821, filed on May 13, 2009.

(51) Int. Cl.
| H05H 1/24 | (2006.01) |
| H01L 21/02 | (2006.01) |
| H01L 21/314 | (2006.01) |
| H01L 21/768 | (2006.01) |
| C23C 16/36 | (2006.01) |

(52) U.S. Cl.
CPC .......... *C23C 16/36* (2013.01); *H01L 21/02211* (2013.01); *H01L 21/3148* (2013.01); *H01L 21/76834* (2013.01); *H01L 21/76831* (2013.01); *H01L 21/02167* (2013.01); *H01L 21/02274* (2013.01)
USPC ........................ 427/579; 427/249.15; 427/578

(58) Field of Classification Search
USPC ...................................... 427/578, 579, 249.15
See application file for complete search history.

(56) References Cited

U.S. PATENT DOCUMENTS

| 5,502,146 A | 3/1996 | Inoue et al. |
| 5,874,368 A | 2/1999 | Laxman |

(Continued)

FOREIGN PATENT DOCUMENTS

| CN | 1372302 A | 10/2002 |
| CN | 1518076 A | 8/2004 |

(Continued)

OTHER PUBLICATIONS

Blaszczyk-Lezak, et al.; "Silicon Carbonitride by Remote Microwave Plasma CVD from Organosilicon Precursor: Physical and Mechanical Properties of Deposited Si: C: N Films"; Applied Surface Science, Elsevier; vol. 253, No. 18; Jun. 7, 2007; pp. 7404-7411; XP022107405.

(Continued)

*Primary Examiner* — Elizabeth Burkhart
(74) *Attorney, Agent, or Firm* — Rosaleen P. Morris-Oskanian; Joseph D. Rossi

(57) ABSTRACT

A process for forming a silicon carbonitride barrier dielectric film between a dielectric film and a metal interconnect of an integrated circuit substrate, comprising the steps of;
providing the integrated circuit substrate having a dielectric film;
contacting the substrate with a barrier dielectric film precursor comprising:

$R_xR'_y(NR''R''')_zSi$ wherein R, R', R" and R'" are each individually selected from hydrogen, linear or branched saturated or unsaturated alkyl, or aromatic; wherein x+y+z=4; z=1-3; but R, R' cannot both be hydrogen;
forming the silicon carbonitride barrier dielectric film with C/Si ratio >0.8 and a N/Si ratio >0.2 on the integrated circuit substrate.

7 Claims, 5 Drawing Sheets

(56) References Cited

U.S. PATENT DOCUMENTS

| | | | |
|---|---|---|---|
| 6,153,261 | A | 11/2000 | Xia et al. |
| 6,500,772 | B2 | 12/2002 | Chakravarti et al. |
| 6,537,911 | B2 | 3/2003 | Ko |
| 7,049,200 | B2 | 5/2006 | Arghavani et al. |
| 7,122,222 | B2 | 10/2006 | Xiao et al. |
| 7,129,187 | B2 | 10/2006 | Joe |
| 7,259,050 | B2 | 8/2007 | Chen et al. |
| 7,282,438 | B1 | 10/2007 | Yu et al. |
| 7,288,145 | B2 | 10/2007 | Xiao et al. |
| 2003/0186087 | A1* | 10/2003 | Liou et al. .................. 428/698 |
| 2004/0115407 | A1 | 6/2004 | Cohen et al. |
| 2004/0146644 | A1 | 7/2004 | Xiao et al. |
| 2004/0147115 | A1 | 7/2004 | Goundar et al. |
| 2004/0183202 | A1 | 9/2004 | Usami |
| 2005/0080285 | A1 | 4/2005 | Wang et al. |
| 2006/0014399 | A1 | 1/2006 | Joe et al. |
| 2006/0019032 | A1 | 1/2006 | Wang et al. |
| 2006/0045986 | A1 | 3/2006 | Hochberg et al. |
| 2006/0182885 | A1* | 8/2006 | Lei et al. .................. 427/248.1 |
| 2006/0258173 | A1* | 11/2006 | Xiao et al. .................. 438/780 |
| 2006/0269692 | A1 | 11/2006 | Balseanu et al. |
| 2007/0096304 | A1 | 5/2007 | Kabir |
| 2008/0019513 | A1 | 1/2008 | Fritz et al. |
| 2008/0099918 | A1 | 5/2008 | Streck et al. |
| 2008/0146007 | A1 | 6/2008 | Balseanu et al. |
| 2008/0166870 | A1 | 7/2008 | Huang et al. |
| 2008/0173985 | A1 | 7/2008 | Belyansky et al. |
| 2009/0093132 | A1* | 4/2009 | Xu et al. .................. 438/780 |
| 2010/0190942 | A1 | 7/2010 | Hosaka et al. |

FOREIGN PATENT DOCUMENTS

| | | |
|---|---|---|
| EP | 1 441 042 A1 | 7/2004 |
| EP | 1 630 249 A2 | 3/2006 |
| EP | 1 724 373 A1 | 11/2006 |
| EP | 1908767 A1 | 4/2008 |
| EP | 1 932 941 A1 | 6/2008 |
| EP | 2 123 445 A1 | 11/2009 |
| EP | 2 192 207 A1 | 6/2010 |
| JP | 2001-183639 | 7/2001 |
| JP | 2004-228585 | 8/2004 |
| JP | 2004223769 A2 | 8/2004 |
| JP | 2004-253780 | 9/2004 |
| JP | 2005-026244 | 1/2005 |
| JP | 2005-175405 | 6/2005 |
| JP | 2005-310861 | 11/2005 |
| JP | 2005-310861 A | 11/2005 |
| JP | 2006-120992 | 5/2006 |
| JP | 2006-294485 A | 10/2006 |
| JP | 2007092166 A2 | 4/2007 |
| KR | 2008-0009729 A | 1/2008 |
| KR | 2008-0026195 | 3/2008 |
| TW | 200703469 | 1/2007 |
| WO | 2006127462 A2 | 11/2006 |
| WO | 2008-096616 A1 | 8/2008 |

OTHER PUBLICATIONS

H. Aoki, et al, EB Resist Characteristics of Water Soluble Poly(siloxyethylene glycol), Journal of Photopolymer Science and Technology, 1997, 325-328.

J. Grobe, et al, Alternativ-Liganden I. Darstellung Von Chelat-Liganden Mit Si-X(CH3)2 UND C-X(CH3)2-Donor-Gruppierungen (X=N UND/ODER P), Journal of Organometallic Chemistry, 1971, 13-23.

N. Auner, Silaheterocycles. VI. Preparation and [2+4] cycoloaddition reactions of 1-vinyl-1-chloro-3-neopentylsilaethene, Journal of Organometallic Chemistry, 1989, 175-195, 377.

B. Wrackmeyer, et al, 13C, 15N and 29Si nuclear magnetic resonance studies of some aminosilanes and aminodisilanes, Spectrochimica Acta, 1989, 1101-1111.

H. Aoki, et al., EB Resist Characteristics of Water Soluble Poly(siloxyethylene glycol), Journal of Photopolymer Science and Technology, 1997, 325-328.

J. Grobe, et al., Alternative-Liganden I. Darstellung Von Chelat-Liganden Mit Si-X(CH3)2 UND C-X(CH3)2-Donor-Gruppierungen (X=N. UND/ODER P), Journal of Organometallic Chemistry, 1971, 13-23.

N. Auner, Silaheterocycles. VI. Preparation and [2+4] cycoloaddition reactions of 1-vinyl-l-chloro-3- neopentysilaethene, Journal of Organometallic Chemistry, 1989, 175-195, 377.

U. Lauter, et al., Vinyl-Substituted Silphenylene Copolymers: Novel High-Temperature Elastomers; Macromolecules; vol. 32, 1999, pp. 3426-3431.

N. C. Billingham, et al., Cyclopolymerization of Diallylsilanes; Journal of Polmer Science; vol. 15, Mar. 1977; pp. 675-681.

H. Aoki, et al., Poly(Divinylsiloxyethylene Clycol)—Synthesis and Photoresist Characteristics; Macromolecular; Rapid Communications; vol. 18, No. 1; Jan. 1, 1997; pp. 31-36.

H. Ohta., et al., Novel Stack-SIN Gate Dielectrics for High Performance 30 nm CMOS for 45 nm Node With Uniaxial Strained Silicon; 26th Annual Symposium on VLSI Technology, Jun. 13-15, 2006; pp. 176-177.

B. Wrackmeyer, et al., 13C, 15N and 29S/Nuclear Magnetic Resonance Studies of Some Aminosilanes and Aminodisilanes, Spectrochimica Acta, 1989, 1101-1111, 45A.

M. Belyansky, et al., Methods Of Producing Plasma Enhanced Chemical Vapor Deposition Silicon Nitride Thin Films with High Compressive And Tensile Stress, J. Vac. Sci. Technology A 26(3) 2008, pp. 517-521.

Scott E. Thompson, et al., A Logic Nanotechnology Featuring Strained-Silicon, IEEE Elec. Device Letters, vol. 25, No. 4, 2004, pp. 191-193.

David M. Hoffman et al., Plasma Enhanced Chemical Vapor Deposition Of Silicon Nitride Films From A Metal-Organic Precursor. J. Mater. Res., vol. 9, No. 12, 1994, pp. 3019-3021.

Hedaya, et al., D2-meta-Carborane-Siloxanes. IV. Synthesis of Linear, High Molecular Weight Polymers, Journal of Polymer Science: Polymer Chemistry Edition, 1977, 15(9), 2229-2238.

Hidetoshi Aoki, et al., Water-Soluble Silicon Containing Polymer Resist, Journal of Poly. Sci., Part A: Poly. Chem., vol. 35, 14, pp. 2827-2833.

* cited by examiner

DIELECTRIC BARRIER DEPOSITION USING NITROGEN CONTAINING PRECURSOR

CROSS REFERENCE TO RELATED APPLICATION

The present patent application claims the benefit of U.S. Provisional Patent Application Ser. No. 61/177,821 filed May 13, 2009.

BACKGROUND OF THE INVENTION

Current low K (dielectric) barrier films cannot meet all the desired requirements, especially low K, high density, Cu diffusion barrier property, O2 diffusion barrier property.

In the microelectronics industry, pattern density shrinks have enabled significant performance gains and continue to occur in the predictable 2 year cycle according to Moore's Law. In order to maintain or improve the operations of a device, both transistor and interconnect level changes have been made. More specifically focusing on the interconnect structures (commonly referred to as the back-end-of line, BEOL), the dimensional shrink has caused a transition from aluminum to copper metallization in order to maintain tolerable line resistances. In order to maintain adequate capacitance between copper lines, the dielectric or insulating films that enclose the copper lines have also changed to compensate for the integration changes necessary for the patterning changes. In order to minimize capacitance of the insulating films, the dielectric constant of each dielectric should ideally be continually reduced. For the interlevel dielectrics ("ILD"), this transition has continually occurred from silicon dioxide to fluorosilicate glass to dense organosilicate glass and finally to porous organosilicate glass with k values of 4.0, 3.3-3.7, 2.7-3.1, and <2.6, respectively.

Typically, the ILD insulating films can retain moisture and O2 in the dielectrics. Given that copper is susceptible to rapid oxidation that can cause reliability issues, barrier dielectrics comprise a portion of the dielectric stack to serve as a diffusion barrier between the copper lines and ILD films, preventing diffusion of water and O2 from the ILD onto the copper surface and preventing copper diffusion into the ILD films. Contrary to the trends for ILD films, the barrier dielectrics have not scaled significantly, due to the reliability functions that the dielectrics serve within the interconnect structure. However, given the disproportionate scaling in dielectric constant of the ILD films relative to the barrier dielectrics, the capacitance contribution of the barriers now is more significant to the overall capacitance of the interconnect structure than in previous technology nodes.

Other semiconductor applications, such as photovoltaics and thin-film display devices, also have requirements for lower k value dielectric barrier films. In addition, the ability to tune the dielectric properties for density, refractive index, film composition and electrical properties is important for extendibility.

Within the current generation of ILD materials, an additional ultraviolet curing step is needed after deposition. Given that the barrier films may exist below the low k ILD films, current generation of barrier films tend to acquire tensile stresses, which further contribute to cracking and deformation of BEOL interconnects. The current industry standard precursors, 3MS (trimethylsilane) or 4MS (tetramethylsilane), cannot meet all the requirements, especially the ability to lower the K values, while maintaining barrier properties. Patents relevant to this field in general include:

US 2008/0197513; US 2008/0173985; US 2008/0099918; U.S. Pat. No. 7,129,187; U.S. Pat. No. 6,500,772; U.S. Pat. No. 7,049,200; U.S. Pat. No. 7,259,050; and U.S. Pat. No. 6,153,261.

In this invention in at least one embodiment, plasma enhanced chemical vapor deposition (PECVD) processes with aminosilane precursors specified below provide dielectric films with dielectric constants that are comparable or lower than current barrier dielectric films while still maintaining adequate barrier properties. These properties include high density, hermeticity and thermal stability.

BRIEF SUMMARY OF THE INVENTION

A process for forming a silicon carbonitride barrier dielectric film between a dielectric film and a metal interconnect of an integrated circuit substrate, comprising the steps of;

providing the integrated circuit substrate having a dielectric film;

contacting the substrate with a barrier dielectric film precursor comprising:

$$R_xR'_y(NR''R''')_zSi$$

wherein R, R', R" and R'" are each individually selected from hydrogen, linear or branched saturated or unsaturated alkyl, or aromatic; wherein x+y+z=4; z=1-3; but R, R' cannot both be hydrogen;

forming the silicon carbonitride barrier dielectric film with C/Si ratio >0.8 and a N/Si ratio >0.2 on the integrated circuit substrate.

Preferably the forming is conducted without a nitrogen-containing additional reactant.

Preferably, the barrier dielectric film precursor is selected from the group consisting of:
bis(isopropylamino)vinylmethylsilane; bis(isopropylamino)divinylsilane; bis(t-butylamino)vinylmethylsilane; bis(t-butylamino)divinylsilane; bis(diethylamino)vinylmethylsilane; bis(diethylamino)divinylsilane; bis(dimethylamino)vinylmethylsilane; bis(dimethylamino)divinylsilane; bis(methylethylamino)vinylmethylsilane; bis(methylethylamino)divinylsilane; bis(isopropylamino)allylmethylsilane; bis(isopropylamino)diallylsilane; bis(t-butylamino)allylmethylsilane; bis(t-butylamino)diallylsilane; bis(diethylamino)allylmethylsilane; bis(diethylamino)diallylsilane; bis(dimethylamino)allylmethylsilane; bis(dimethylamino)diallylsilane; bis(methylethylamino)allylmethylsilane; bis(methylethylamino)diallylsilane; bis(isopropylamino)methylsilane; bis(isopropylamino)dimethylsilane; bis(t-butylamino)methylsilane; bis(t-butylamino)dimethylsilane; bis(diethylamino)methylsilane; bis(diethylamino)dimethylsilane; bis(dimethylamino)methylsilane; bis(dimethylamino)dimethylsilane; bis(methylethylamino)methylsilane; bis(methylethylamino)dimethylsilane; and mixtures thereof.

DETAILED DESCRIPTION OF THE INVENTION

Figure 1A:
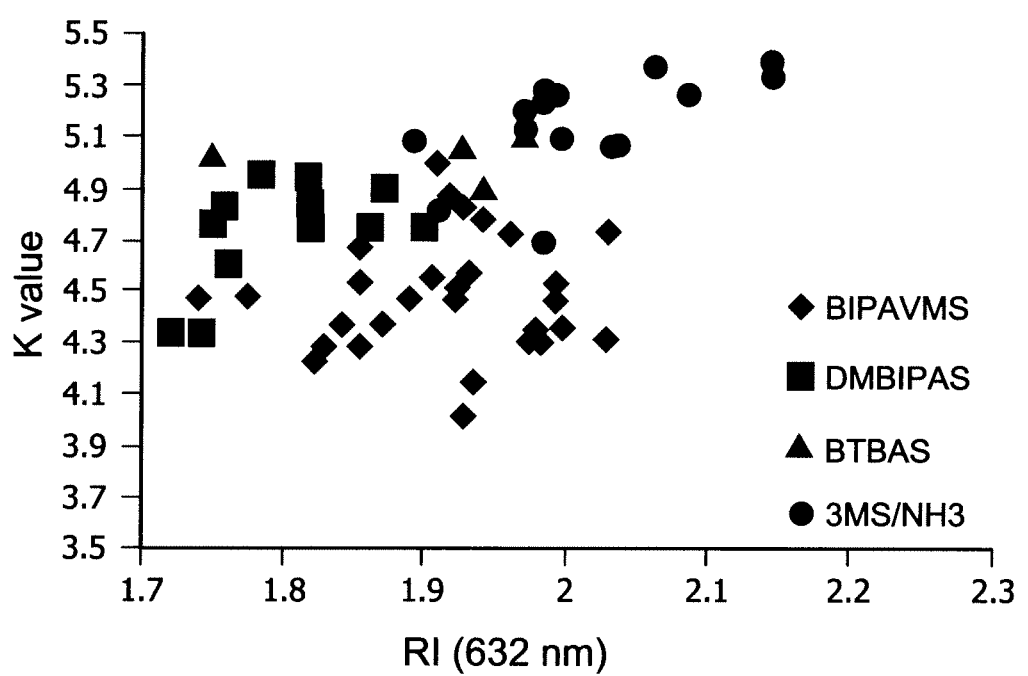
FIG. 1A is a plot of refractive index (RI) (at 632 nm) versus dielectric constant (K) for different precursors for films deposited at 350 C by PECVD.

A method is provided for depositing a dielectric barrier film including a precursor with silicon, carbon, nitrogen, and hydrogen with improved barrier dielectric properties including lower dielectric constant. This method will be important for barrier layers used in a damascene or dual damascene integration for interconnect structures or in other applications, where a diffusion barrier is necessary. In this example, specific structural properties are noted that improve the barrier performance above existing precursors that are employed today.

A process for forming a silicon carbonitride barrier dielectric film between a dielectric film and a metal interconnect of an integrated circuit substrate, comprising the steps of;

providing the integrated circuit substrate having a dielectric film;

contacting the substrate with a barrier dielectric film precursor comprising:

wherein R, R', R" and R'" are each individually selected from hydrogen, linear or branched saturated or unsaturated alkyl, or aromatic; wherein x+y+z=4; z=1-3; but R, R' cannot both be hydrogen;

forming the silicon carbonitride barrier dielectric film with C/Si ratio >0.8 and a N/Si ratio >0.2 on the integrated circuit substrate. In the process, a metal interconnect is provided after the forming of the silicon carbonitride barrier dielectric film is formed or the metal interconnect is provided before the forming of the silicon carbonitride barrier dielectric film is formed. With regard to the latter, the dielectric film is provided after the forming of the silicon carbonitride barrier dielectric film is formed.

Preferably, the forming is performed without an additional nitrogen-containing reactant.

Preferably, the barrier dielectric film precursor is selected from the group consisting of, bis(isopropylamino)vinylmethylsilane; bis(isopropylamino)divinylsilane; bis(t-butylamino)vinylmethylsilane; bis(t-butylamino)divinylsilane; bis(diethylamino)vinylmethylsilane; bis(diethylamino)divinylsilane; bis(dimethylamino)vinylmethylsilane; bis(dimethylamino)divinylsilane; bis(methylethylamino)vinylmethylsilane; bis(methylethylamino)divinylsilane; bis(isopropylamino)allylmethylsilane; bis(isopropylamino)diallylsilane; bis(t-butylamino)allylmethylsilane; bis(t-butylamino)diallylsilane; bis(diethylamino)allylmethylsilane; bis(diethylamino)diallylsilane; bis(dimethylamino)allylmethylsilane; bis(dimethylamino)diallylsilane; bis(methylethylamino)allylmethylsilane; bis(methylethylamino)diallylsilane; bis(isopropylamino)methylsilane; bis(isopropylamino)dimethylsilane; bis(t-butylamino)methylsilane; bis(t-butylamino)dimethylsilane; bis(diethylamino)methylsilane; bis(diethylamino)dimethylsilane; bis(dimethylamino)methylsilane; bis(dimethylamino)dimethylsilane; bis(methylethylamino)methylsilane; bis(methylethylamino)dimethylsilane, and mixtures thereof.

Although a single process step is preferred, in many instances it is also within the scope of the invention to post-treat the film after deposition. Such post-treating can include, e.g., at least one of thermal treatment, plasma treatment, UV/Visible/IR radiation, and chemical treatment to improve one or more of the film properties. For example, the post-treatment may provide lower dielectric constants while maintaining the desired density and/or stress.

Energy is applied to the gaseous reagents to induce the gases to react and to form the film on the substrate. Such energy can be provided by, e.g., plasma, pulsed plasma, helicon plasma, high density plasma, inductively coupled plasma, and remote plasma methods. A secondary radio frequency (rf) frequency source can be used to modify the plasma characteristics at the substrate surface.

The flow rate for each of the gaseous reagents preferably ranges from 10 to 5000 standard cubic centimeters per minute (sccm), more preferably from 200 to 2000 sccm, per single 200 millimeter (mm) wafer. Liquid chemical flows are in the range of 0.1 to 10 grams (g)/minute, preferably 0.5 to 3 g/minute. The individual rates are selected so as to provide the desired amounts and ratios of silicon, carbon, nitrogen, hydrogen, etc., in the film. The actual flow rates needed may depend upon substrate size and chamber configuration, and are in no way limited to 200 mm wafers or single wafer chambers.

The pressure in the vacuum chamber during deposition is preferably 0.01 to 760 torr, more preferably 1 to 20 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 10 mm outermost edge of the substrate is not included in the statistical calculation of uniformity.

The density of the film can be increased with the correspondingly increased dielectric constant of the material. To extend the applicability of this material to future generations, deposition conditions for this precursor can be tuned such that the dielectric constant can be lowered. For this class of precursors under the specified range of deposition conditions, there exists a wide range of dielectric constants and achievable densities. It will be common knowledge to those familiar with the art to be able to modify film properties with deposition conditions.

Films of the invention preferably have a density of 1.5 g/cubic centimeter (cc) or greater, or alternatively, 1.8 g/cc or greater. More preferably the densities are 1.6 g/cc to 2.2 g/cc, most preferably 1.7 g/cc to 2.0 g/cc.

Films of the invention have improved properties relative to known films produced from other candidate precursors such as trimethylsilane and tetramethylsilane. In certain embodiments, the film has a dielectric constant less than 6.0, preferably less than 5.0 more preferably 4.0 to 4.5.

The films of the present invention preferably have a RI of 1.7 to 2.2, more preferably 1.8 to 2.0.

The films of the present invention preferably have a C/Si ratio greater than 0.8, more preferably greater than 1.2.

The films of the present invention preferably have a N/Si ratio greater than 0.2.

Alternatively, the silicon carbonitride barrier dielectric film has a compositional gradient of silicon, carbon and nitrogen varied across the depth of the film, such gradient created by varying the process conditions of precursor flow, diluents flow, power, pressure, etc. The value of a gradient film can enable optimized and tuned properties for deposition on the underlying metal layer. The upper portion of the gradient layer can in fact be tuned for improved etch selectivity properties. Other variations of a graded layer may exist in order to tune the films for improved properties including but not limited to adhesion either to the underlying dielectric layer and the metal layer, improved film density within the graded layer, reduced dielectric constant for the entire barrier film composite. These are examples of properties that may necessitate a graded layer, but they are not limited to these properties. One skilled in the art will understand the multitude of integration needs within a semiconductor device which may lead to a graded film stack.

Films of the invention are thermally stable, with good chemical resistance.

The films are suitable for a variety of uses. The films are particularly suitable for use as a barrier film to prevent species diffusion into other integrated layers. In one embodiment, the deposition is performed on a semiconductor substrate, and is particularly suitable for use as, e.g., an insulation layer, a capping layer, a chemical-mechanical planarization (CMP) or etch stop layer, a barrier layer (e.g., against diffusion of metals, water or other materials that can be undesirable in insulating layers) and/or an adhesion layer in an integrated circuit. The films can form a conformal coating. The mechanical properties exhibited by these films make them particularly suitable for use in Al subtractive technology and Cu damascene technology.

The films are compatible with chemical mechanical planarization and anisotropic etching, and are capable of adhering to a variety of materials, such as silicon, $SiO_2$, $Si_3N_4$, organosilicate glass (OSG), fluorosilicate glass (FSG), silicon carbide, antireflective coatings, photoresists, organic polymers, porous organic and inorganic materials, metals, such as copper, tantalum, tantalum nitride, manganese, ruthenium, cobalt and aluminum, and metal barrier layers, and copper adhesion treatment processes.

Although the invention is particularly suitable for providing films, and products of the invention are largely described herein as films, the invention is not limited thereto. Products of the invention can be provided in any form capable of being deposited by chemical vapor deposition (CVD) or atomic layer deposition (ALD), such as coatings, multilaminar assemblies, and other types of objects that are not necessarily planar or thin, and a multitude of objects not necessarily used in integrated circuits.

In the present invention, we have found that generally aminosilanes as a replacement to either 3MS or 4MS for barrier dielectric films can improve the barrier properties of the dielectric film, while keeping or reducing the dielectric constant.

In this invention, preferably plasma enhanced chemical vapor deposition is used with a class of aminosilane precursor to form a silicon carbonitride film. Traditionally, the standard barrier dielectric deposition processes have incorporated alkylsilanes (ie. trimethylsilane and tetramethylsilane) with either oxidants (carbon dioxides, oxygen, or nitrous oxide) or nitrogen containing reactant gases (nitrogen and ammonia) to form oxygen or nitrogen silicon carbide films. However, there is a limitation to how low the dielectric constants for this deposition can be scaled, while still maintaining desirable density.

To serve as an etch stop film, reasonable film selectivity between the ULK (ultra low k) film and the barrier dielectric film needs to be achieved. A higher refractive index barrier film typically provides better selectivity, specifically >1.5, preferably >1.7. During our testing, it was found that in order to get higher refractive index films, the generic precursor structures described above work well. This specific class of precursors provides improved properties, given that a high refractive index and lower dielectric constant are simultaneously achieved. Other classes of precursors can exhibit reduced refractive index values, when the k value is reduced. This can lead to a loss in etch selectivity, even though the electrical needs are achieved.

The second desirable property of a barrier film is the barrier diffusion properties, specifically to prevent moisture diffusion, which can contribute to reliability failures in an electrical device. Film density is typically used as a strong indicator of diffusion properties. Current state of the art barrier films in the industry typically have densities of 1.8-2.0 g/cc, utilizing trimethylsilane or tetramethylsilane as the precursor. However, the issue with precursors in the prior art is that in order to get the desired densities needed for adequate barrier properties, it is difficult to scale the dielectric constant.

In some integration schemes, there will be exposed copper prior to dielectric deposition. In some integration schemes, there is concern about resist-poisoning from nitrogen containing barriers. In such cases, an oxygen containing barrier layer is desired. For example, a thin 20-600 angstrom (Å) SiCO barrier layer can be used. In another embodiment, the interface layer could be an alternative surface layer that is used to form a good interface.

Another potential problem associated with the current 3MS or 4MS barrier dielectric films is the change in film properties with exposure to ultraviolet ("UV") radiation or electron beam, specifically properties, such as; an increase in dielectric constant or change in film stress. In some integration schemes, the use of UV maybe incorporated and changes in the film properties can cause potential issues with reliability or other electrical metrics, such as integrated capacitance. In the example below, use of aminosilanes with specific deposition gases (i.e., hydrogen) reduces the film's susceptibility to K shift with UV exposure and also stress changes.

EXPERIMENTAL

All depositions were performed using a 200 mm P5000 Applied Materials PECVD DXZ or DXL chamber fitted with an Advanced Energy 2000 RF generator with direct liquid injection. With the exception of 3MS results, all other precursors were liquid precursors with varied delivery temperatures dependent on the precursor's boiling point.

In the following examples, unless stated otherwise, properties were obtained from sample films that were deposited onto medium resistivity (8-12 Ωcm) single crystal silicon wafer substrates. Thickness and optical properties, such as refractive index of the dielectric films, were measured on an SCI Filmtek Reflectometer. The refractive index is measured using 632 nanometer (nm) wavelength light.

A mercury probe was utilized for all film measurements where dielectric constant, electrical breakdown field and leakage are presented. Bonding properties of the dielectric films were analyzed with a Nicolet 750 transmission FTIR tool using a $N_2$ purgedbench. Background spectra were collected on similar medium resistivity wafers to eliminate $CO_2$ and water from the spectra. Data was obtained in the range of from 4000 to 400 $cm^{-1}$ by collecting 32 scans with a resolution of 4 $cm^{-1}$. The OMNIC software package was used to process the data. All density measurements were performed with X-ray reflectivity using a 2-layer model.

In FIG. 1A a plot of refractive index (at 632 nm) versus dielectric constant (K) for different precursors for films deposited at 350° C. by PECVD is shown, where: 3MS is trimethylsilane, BTBAS is bis(t-butylamino)silane, DMBIPAS is dimethylbis(isopropylamino) silane and BIPAVMS is bis(isopropylamino)vinylmethylsilane. From the experiments, 3MS/NH$_3$ and BTBAS films were both in the K range of 4.7-5.5. DMBIPAS films had lower K of 4.3-5.0, and BIPAVMS films had even lower K of 4.0-5.0. These aminosilanes precursors are thus capable of providing equivalent or lower K values to current processes. Refractive index (RI) of 1.85-1.95 is generally preferred for good etch selectivity to low K. BIPAVMS films show lower K potential in the target RI range.

Figure 1B:
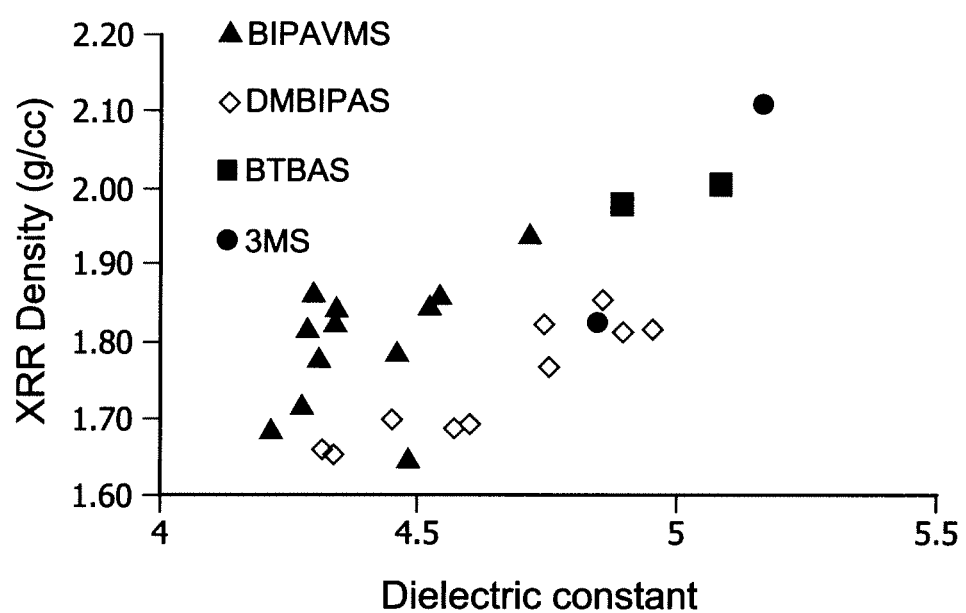
FIG. 1B is a plot of density versus dielectric constant (K) for different precursors for films deposited at 350 C by PECVD.

In FIG. 1B, a plot of density versus dielectric constant (K) for different precursors for films deposited at 350° C. by PECVD is shown, including: 3MS; BTBAS; DMBIPAS; and BIPAVMS. For a given K value, a higher density is preferred for barrier films. DMBIPAS and BIPAVMS can provide lower K films than 3MS. Several BIPAVMS films have density >1.8 g/cc, while lowering k value to <4.5.

Figure 2A:
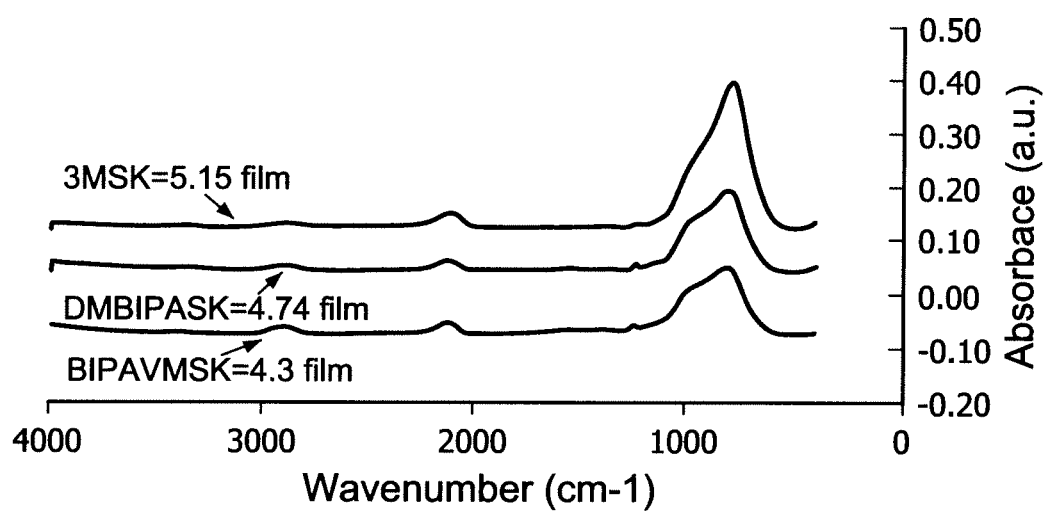
FIG. 2A is an Fourier Infrared Spectroscopy (FTIR) comparison of 3MS/NH3 K=5.1 film with dimethylbis(isopropylamino)silane (DMBIPAS) (K=4.74 film) and bis(isopropylamino)vinylmethylsilane (BIPAVMS) (K=4.3 film).

In FIG. 2A, an FTIR comparison of 3MS/NH$_3$ K=5.1 film with DMBIPAS (K=4.74 film) and BIPAVMS (K=4.3 film) is shown. In general, C—H bonds at ~2900 cm-1 increase as K is lowered. However, DMBIPAS and BIPAVMS show more N—H bonding (at 3300 cm-1) and also more Si—CH$_2$—Si bonding at ~1000 cm-1. The higher density of the films formed with these precursors can be correlated to the higher N % and backbone content. Thus, these precursors are superior to existing 3MS/NH$_3$ technology in incorporating functionalities, that improve density, while lowering K.

Figure 2B:
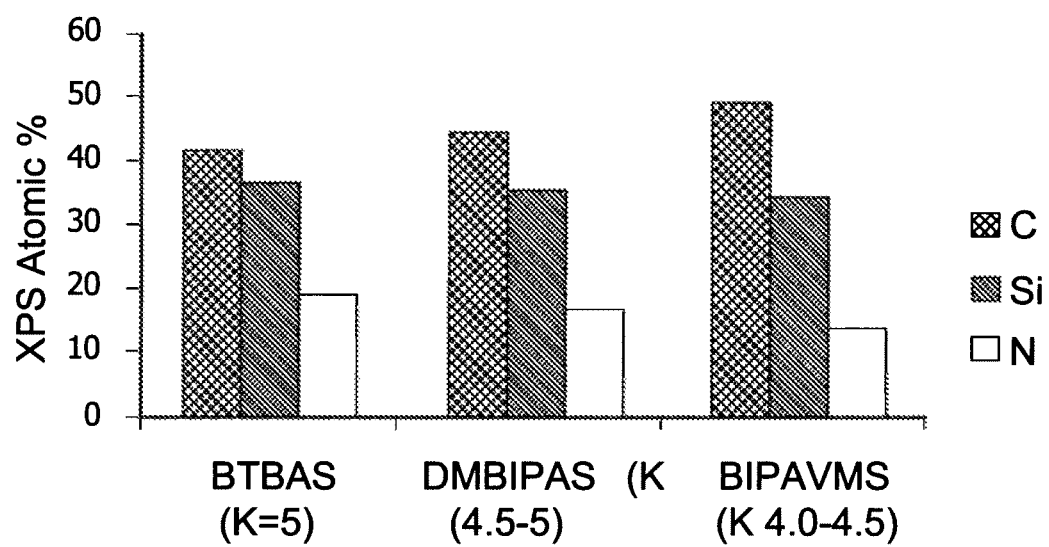
FIG. 2B is a comparison of % elemental composition of SiCN films as measured by X-ray Photoelectron Spectroscopy (XPS): Bis(tertiarybutylamino)silane (BTBAS); DMBIPAS; and BIPAVMS.

In FIG. 2B, a comparison of % elemental composition of SiCN films as measured by XPS is graphed. BTBAS film of K=5 has significantly higher nitrogen content, than a 3MS/NH$_3$ film of similar K. DMBIPAS and BIPAVMS films of lower K have higher C %, but continue to retain high amounts of nitrogen. Thus, this family of precursors gives low K films, while retaining beneficial properties, such as good density, RI, etch selectivity.

Figure 3:
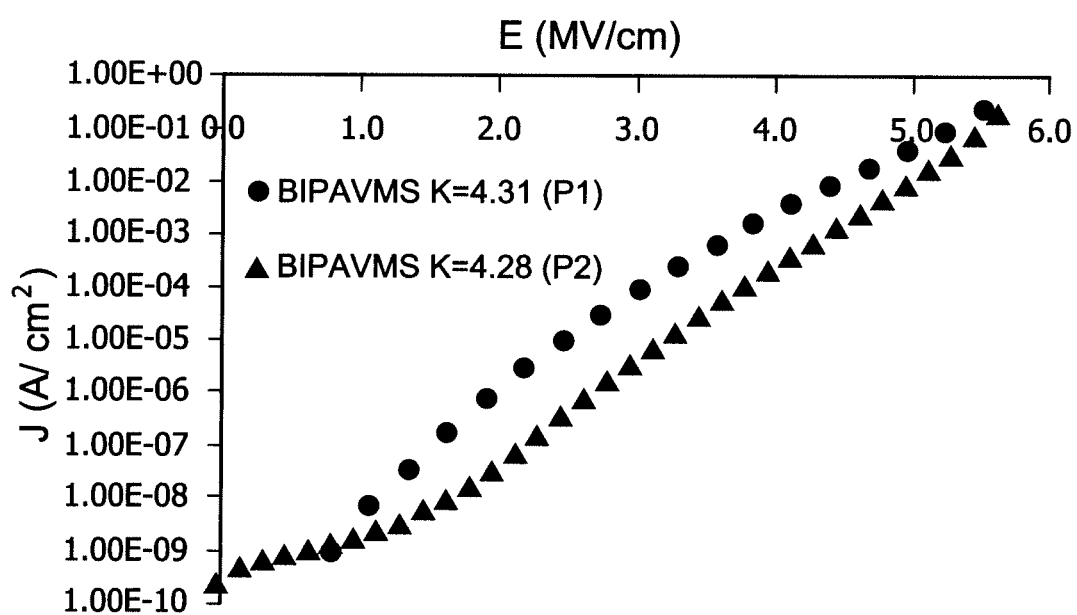
FIG. 3 shows leakage current density (A/cm$^2$) vs applied electric field (MV/cm) for BIPAVMS films deposited under two different conditions, but having about the same K value.

FIG. 3 shows leakage current density (A/cm$^2$) versus applied electric field (MV/cm) for BIPAVMS films deposited under two different conditions, but having about the same K value. A more than 10× improvement in leakage at 2 MV/cm is seen for condition P2 vs condition P1. By tailoring the process condition for the precursor, it is possible to obtain low leakage films that satisfy stringent electrical requirements.

The barrier dielectric film precursor is preferably selected from the precursor group mentioned earlier, examples of which are;
bis(isopropylamino)vinylmethylsilane; bis(isopropylamino)divinylsilane; bis(t-butylamino)vinylmethylsilane; bis(t-butylamino)divinylsilane; bis(diethylamino)vinylmethylsilane; bis(diethylamino)divinylsilane; bis(dimethylamino)vinylmethylsilane; bis(dimethylamino)divinylsilane; bis(methylethylamino)vinylmethylsilane; bis(methylethylamino)divinylsilane; bis(isopropylamino)allylmethylsilane; bis(isopropylamino)diallylsilane; bis(t-butylamino)allylmethylsilane; bis(t-butylamino)diallylsilane; bis(diethylamino)allylmethylsilane; bis(diethylamino)diallylsilane; bis(dimethylamino)allylmethylsilane; bis(dimethylamino)diallylsilane; bis(methylethylamino)allylmethylsilane; bis(methylethylamino)diallylsilane; bis(isopropylamino)methylsilane; bis(isopropylamino)dimethylsilane; bis(t-butylamino)methylsilane; bis(t-butylamino)dimethylsilane; bis(diethylamino)methylsilane; bis(diethylamino)dimethylsilane; bis(dimethylamino)methylsilane; bis(dimethylamino)dimethylsilane; bis(methylethylamino)methylsilane; bis(methylethylamino)dimethylsilane; and mixtures thereof.

Following examples (example 1-3) illustrate some PECVD conditions and corresponding film properties. 200 mm wafers were processed in a 200 mm Applied Materials chamber having a susceptor temperature of 350-400° C. Once the precursor (100-1000 mg/min) and carrier gas (He or N$_2$) flow rates (500-2500 sccm) were established, the pressure was stabilized at 2.0-5.0 torr. Some depositions also use H$_2$ (100-500 sccm) and/or NH$_3$ (100-500 sccm). RF power (13.56 MHz, 200-800 W) was then applied for 60-200 seconds to deposit the silicon carbonitride films. Following deposition, the silicon wafers were removed from the PECVD chamber, and the chamber was cleaned using a NF$_3$ plasma. Examples are meant for illustration only. One skilled in the art will understand that modifying the deposition parameters, such as temperature, pressure, flow, power, spacing, etc., will change the film properties, and thus, further optimization is possible.

Although all examples here are provided with addition of H$_2$ as a process gas, this is not necessary. The details are given in Table 2. Example 1 is an illustration of BTBAS precursor and conditions that provide an excellent barrier film of high density and high quality. Examples 2 and 3 are with DMBIPAS and BIPAVMS, respectively. Both illustrate that K can be lowered, while density is maintained at >1.8 g/cc.

TABLE 1

|  | Example 1 | Example 2 | Example 3 |
|---|---|---|---|
| Condition | BTBAS | DMBIPAS | BIPAVMS |
| Chamber | DXZ | DXZ | DXL |
| Power (W) | 600 | 800 | 400 |
| Spacing (mils) | 400 | 400 | 400 |
| Pressure (Torr) | 4.5 | 3 | 5 |
| Temperature ° C. | 400 | 350 | 350 |
| He (sccm) | 1800 | 400 | 1200 |
| H2 (sccm) | 600 | 500 | 450 |
| Precursor flow (mg/min) | 600 | 300 | 300 |
| Film RI | 2 | 1.873 | 1.906 |
| Film K | 5.1 | 4.9 | 4.54 |
| Film density | 2 | 1.82 | 1.865 |
| Film stress | −513 | −323 | −275 |

The invention claimed is:

1. A process for forming a silicon carbonitride barrier dielectric film between a dielectric film and a metal interconnect of an integrated circuit substrate, comprising the steps of:
   providing the integrated circuit substrate having a dielectric film;
   contacting the substrate with a barrier dielectric film precursor selected from the group consisting of bis(isopropylamino)vinylmethylsilane, bis(isopropylamino)divinylsilane, bis(t-butylamino)vinylmethylsilane, bis(t-butylamino)divinylsilane, bis(diethylamino)vinylmethylsilane, bis(diethylamino)divinylsilane, bis(dimethylamino)vinylmethylsilane, bis(dimethylamino)divinylsilane, bis(methylethylamino)vinylmethylsilane, bis(methylethylamino)divinylsilane, bis(isopropylamino)allylmethylsilane, bis(isopropylamino)diallylsilane, bis(t-butylamino)allylmethylsilane, bis(t-butylamino)diallylsilane, bis(diethylamino)allylmethylsilane, bis(diethylamino)diallylsilane, bis(dimethylamino)allylmethylsilane, bis(dimethylamino)diallylsilane, bis(methylethylamino)allylmethylsilane, bis(methylethylamino)diallylsilane, and mixtures thereof; and forming the silicon carbonitride barrier dielectric film under plasma enhanced chemical vapor deposition conditions, wherein the film has a C/Si ratio >0.8 and a N/Si ratio >0.2 on the integrated circuit substrate, wherein the silicon carbonitride barrier dielectric film has a density in the range of 1.7 to 2.2 g/cc, and wherein the silicon carbonitride barrier dielectric film has a K in the range of 4.0 to 4.5.

2. The process of claim 1 wherein a metal interconnect is provided after the forming of the silicon carbonitride barrier dielectric film is formed.

3. The process of claim 1 wherein the silicon carbonitride barrier dielectric film has a compositional gradient of silicon, carbon and nitrogen varied across the depth of the film.

4. A process for forming a silicon carbonitride barrier dielectric film between a dielectric film and a metal interconnect of an integrated circuit substrate, comprising the steps of:

providing the integrated circuit substrate having a dielectric film;

contacting the substrate with a barrier dielectric film precursor comprising bis(isopropylamino)vinylmethylsilane;

wherein no additional nitrogen-containing reactant is used, wherein the silicon carbonitride barrier dielectric film has a density in the range of 1.7 to 2.2 g/cc, and wherein the silicon carbonitride barrier dielectric film has a K in the range of 4.0 to 4.5.

5. The process of claim 4 including forming the silicon carbonitride barrier dielectric film with C/Si ratio >0.8 and a N/Si ratio >0.2 on the integrated circuit substrate.

6. A process for forming a silicon carbonitride barrier dielectric film between a dielectric film and a metal interconnect of an integrated circuit substrate, comprising the steps of:

providing the integrated circuit substrate having a dielectric film;

contacting the substrate with a barrier dielectric film precursor comprising bis(isopropylamino)divinylsilane;

wherein no additional nitrogen-containing reactant is used, wherein the silicon carbonitride barrier dielectric film has a density in the range of 1.7 to 2.2 g/cc, and wherein the silicon carbonitride barrier dielectric film has a K in the range of 4.0 to 4.5.

7. The process of claim 6 including forming the silicon carbonitride barrier dielectric film with C/Si ratio >0.8 and a N/Si ratio >0.2 on the integrated circuit substrate.

* * * * *